United States Patent
Maret et al.

(10) Patent No.: US 11,287,464 B2
(45) Date of Patent: Mar. 29, 2022

(54) PARTIAL DISCHARGE MEASUREMENT SYSTEM

(71) Applicant: ABB Schweiz AG, Baden (CH)

(72) Inventors: Yannick Maret, Dättwil (CH); Kai Hencken, Lörrach (DE); Stefano Marano, Zürich (CH)

(73) Assignee: ABB Schweiz AG, Baden (CH)

(*) Notice: Subject to any disclaimer, the term of this patent is extended or adjusted under 35 U.S.C. 154(b) by 74 days.

(21) Appl. No.: 16/458,958

(22) Filed: Jul. 1, 2019

(65) Prior Publication Data
US 2020/0003822 A1 Jan. 2, 2020

(30) Foreign Application Priority Data
Jun. 29, 2018 (EP) .................................... 18180873

(51) Int. Cl.
*G01R 31/12* (2020.01)

(52) U.S. Cl.
CPC ................................ *G01R 31/1272* (2013.01)

(58) Field of Classification Search
None
See application file for complete search history.

(56) References Cited

U.S. PATENT DOCUMENTS

| | | | |
|---|---|---|---|
| 6,300,767 B1 | 10/2001 | Kliman et al. | |
| 2003/0207677 A1 | 11/2003 | Hauser et al. | |
| 2004/0246000 A1* | 12/2004 | Kuppuswamy | G01R 31/1254 324/536 |
| 2014/0195577 A1* | 7/2014 | Nikitin | H03H 17/0201 708/304 |

FOREIGN PATENT DOCUMENTS

| | | |
|---|---|---|
| WO | 2013000806 A1 | 1/2013 |
| WO | 2018111115 A1 | 6/2018 |

OTHER PUBLICATIONS

Fallet, Truls et al. Method for Measuring an Impedance of an Electric Cable, a Coupler Arrangement and Uses Thereof; Pub Date: Jun. 21, 2018; Wirescan AS; WO 2018/111115 AI; G01R 15/16, G01R 31/12 (Year: 2018).*
European Patent Office, Extended Search Report issued in corresponding Application No. 18180873.4, dated Dec. 19, 2018, 9 pp.

* cited by examiner

*Primary Examiner* — Nasima Monsur
(74) *Attorney, Agent, or Firm* — Greenberg Traurig, LLP

(57) ABSTRACT

A method and device for determining partial discharge in an electrical insulation system of a medium- or high voltage apparatus, the method and apparatus including: detecting, with a sensing unit, an electrical signal that comprises partial discharge pulses due to dielectric breakdowns in the electrical insulation system of the medium- or high voltage apparatus; generating an in-phase and a quadrature-signal from the electrical signal comprising the partial discharge pulses in an I/Q-mixer unit by mixing the electrical signal including the partial discharge pulses with two local oscillator signals having the same frequency and a phase difference of 90°; filtering each of the in-phase and the quadrature signals with a low-pass filter; processing the filtered in-phase and the quadrature signals in a processing unit with a low-frequency Analog-Digital converter to obtain digital signals representing an in-phase and a quadrature value.

20 Claims, 7 Drawing Sheets

PARTIAL DISCHARGE MEASUREMENT SYSTEM

FIELD OF INVENTION

Aspects of the present disclosure relate to a method and devices for determining partial discharges. Specifically, the disclosure relates to monitoring the status of dielectric strength of a high-voltage installation, especially in a medium or high voltage area. In particular, the disclosure relates to determining partial discharges in isolating mediums, in medium- and high voltage areas.

BACKGROUND OF INVENTION

Monitoring a status of dielectric strength of a high-voltage installation, especially in the medium voltage area is necessary to know about the "health-status" of the dielectric.

Partial Discharges (PD) usually begins within voids, cracks, or inclusions within a solid dielectric, at conductor-dielectric interfaces within solid or liquid dielectrics, or in bubbles within liquid dielectrics. Since partial discharges are limited to only a portion of the insulation, the discharges only partially bridge the distance between electrodes. Partial discharge can also occur along the boundary between different insulating materials.

Within an insulating material, partial discharges are usually initiated within gas-filled voids within the dielectric. The electric field and the critical field strength of the void is different than those of the surrounding material: typically, the former is larger and the latter smaller for the void than the surroundings. If the voltage across the whole insulator is increased such that the field strength within the void is above its critical value, partial discharge activity will start within the void.

Partial discharges can also occur along the surface of solid insulating materials, if the surface tangential electric field is high enough to cause a breakdown along the insulator surface. Partial discharge measurements are an important technique to assess this.

Partial Discharges (PD) are characterized in that they occur as short time events (tens of nanoseconds) and are stochastically recurring in the problematic part of the system. Partial discharge can be measured by looking at the effect of charges flowing during the discharge event. The flow of the charges, in other words a current, results in temporary voltage changes on the high-voltage conductor.

In the IEC 60270 standard, a standard partial discharge measurement system, based on a capacitive coupling to the high-voltage together with a blocking impedance, is used. This is a commonly established approach to measure partial discharges both offline and online.

A typical partial discharge detection hardware consists of the measurement of the pulse ("apparent charge") generated by the partial discharge in the electrical insulation system on the high-voltage bus bar.

In order to be able to detect the apparent charge present in such a partial discharge peak, that is determining the integral over the current flowing, the signal is first processed: In agreement with the IEC 60270 standard, a frequency range is selected which can be typically in a range below 1 MHz. This band-filtering converts the sharp partial discharge peak (which has an internal timely length of ~10 ns-100 ns) into an extended shape that can be measured by using low frequency data acquisition. It can be seen as a quasi-integration in order to measure the overall strength of the pulse irrespective of its shape in time.

The signal is normally sent to an envelope detection system as subsequent part of a first band-pass filtering in order to convert it into a pure amplitude signal, as the phase of the measurement is assumed to be unimportant in the measurement system according to IEC 60270.

One of the problems in online partial discharge measurement is environmental noise present in electric installations. Noise can stem from other devices in the neighbourhood of the measurement system, such as electric circuits with high and fast changing currents, alternating electric high voltage fields or noise from lightning strike. This environment noise is much higher than that found in specially shielded partial discharge labs and would affect a measurement. Being able to distinguish between real partial discharge signals and simply noise is an important topic for a partial discharge measurement system.

It is therefore an objective of the present disclosure to solve or reduce the previously mentioned disadvantages of the prior art, and, in particular, to allow an improved robustness with respect to the noise contained on the high-voltage conductor, and to achieve this at lower cost and higher flexibility.

SUMMARY OF INVENTION

In order to address the foregoing and other potential problems, embodiments of the present disclosure provide:

A method for determining partial discharge in an electrical insulation system of a medium- or high voltage apparatus is provided. The method may comprise: Detecting, with a sensing unit, an electrical signal that can comprise partial discharge pulses due to dielectric breakdowns in the electrical insulation system of the medium- or high voltage apparatus; Generating an in-phase and a quadrature-signal from the electrical signal which can comprise the partial discharge pulses in an I/Q-mixer unit by mixing the electrical signal which can comprise the partial discharge pulses with two local oscillator signals, which can have the same frequency and a phase difference of 90°; Filtering each of the in-phase and the quadrature signals with a low-pass filter; Processing both the filtered in-phase and the quadrature signals with an Analog-Digital converter to obtain digital signals which may represent in-phase and quadrature values. Thanks to I/Q mixing, the Analog-Digital converter can operate at relative low-frequency (e.g. 500 kHz) while acquiring the frequency content of the partial discharge around a much larger frequency (e.g. 10 MHz).

In a further aspect, a partial discharge determining device for detecting partial discharges in an electrical insulation system of a medium- or high voltage apparatus is provided, which can comprise: An input connector with a sensing unit, the sensing unit can be adapted for coupling the device to the medium- or high voltage apparatus, wherein an electrical signal from the medium- or high voltage apparatus can be detected by the sensing unit and may comprise electrical pulses resulting from dielectric breakdowns in the electrical insulation system of the medium- or high voltage apparatus, the electrical signal can be such, that it can be supplied to the device for determining electrical pulses via the input connector with the sensing unit; a mixing unit, which can be configured to generate an in-phase and a quadrature-signal from the electrical signal comprising the partial discharge pulses by mixing the electrical signal comprising the partial discharge pulses with two local oscillator signals having the same frequency and wherein a phase difference between the two local oscillator signals is 90°; Low-pass filters, that can be configured to filter each of the in-phase and the quadrature-signal; a data-processing unit, which can be adapted to process the filtered in-phase and the quadrature-signals in a low-frequency Analog-Digital converter and to be configured to obtain voltage signals representing an in-phase and a quadrature value.

In a further aspect, a partial discharge determining device according to embodiments of the present disclosure is provided, wherein a sensing unit can comprise an antenna, or a transformer or a capacitive coupler, which may be adapted to sense a signal in a predetermined frequency band.

In yet a further aspect, a medium- or high voltage apparatus with a partial discharge determining device in combination with other aspects of the present disclosure is provided.

Aspects of the invention allow an improved robustness with respect to the noise contained in the electrical installation and coupling in the high-voltage apparatus. Further aspects enable an improved signal processing that allows acquiring precise partial discharge data. These advantages may be obtained with low-cost components.

BRIEF DESCRIPTION OF DRAWINGS

Embodiments of the present disclosure will be presented in the sense of examples and their advantages are explained in greater detail below, with reference to the accompanying drawings, wherein.

DETAILED DESCRIPTION OF EMBODIMENTS

Figure 1:
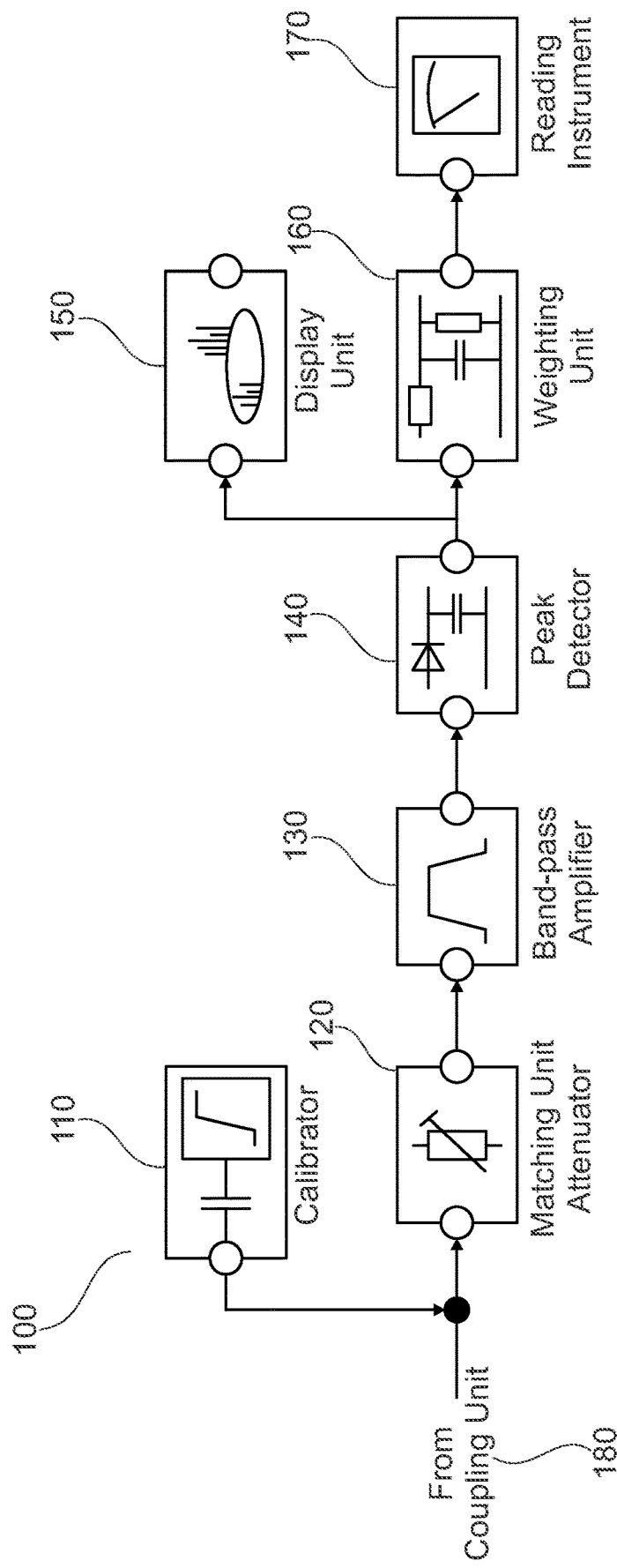
FIG. 1 shows a signal path of a prior art partial discharge measurement system.

Hereinafter, the principle and spirit of the present disclosure will be described with reference to the illustrative embodiments. It should be understood, all these embodiments are given merely for the skilled in the art to better understand and further practice the present disclosure, but not for limiting the scope of the present disclosure. For example, features illustrated or described as part of one embodiment may be used with another embodiment to yield still a further embodiment. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures, systems and devices are schematically depicted in the drawings for purposes of explanation only and so as to not obscure the description with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e. a definition that is different from the ordinary and customary meaning as understood by those skilled in the art, is intended to be implied by consistent usage of the term or phrase herein. To the extent that a term or phrase is intended to have a special meaning, i.e. a meaning other than that understood by skilled artisans, such a special definition will be expressly set forth in the specification in a definitional manner that directly and unequivocally provides the special definition for the term or phrase.

FIG. 1 illustrates a signal path in a partial discharge measurement system 100 according to IEC. A signal, from which is assumed to contain partial discharge pulses, is received from a coupling unit 180 (e.g. a capacitive coupling unit, not shown here). Calibration 110 is applied on the signal and, if necessary, the signal is attenuated 120. An amplifier 130 with a bandpass amplifies a specific range of the signal frequency range. Peak detector 140 determines a potentially peak which may characterize a partial discharge pulse and outputs a result. Display unit 150, weighting unit 160 and reading unit 170 visualize and interpret the output result of the peak detector 140.

Instead of following a usual envelope detection approach as suggested and described in IEC standard and literature in general, it is proposed in the following, to make use of a full I/Q ("in-phase" and "quadrature") mixing approach. I/Q mixer can be performed with analogue or digital I/Q mixers.

That is to say, both, I- and Q-parts of a signal can be determined in a frequency range that can be selected during normal operation of the system. An amplitude and a phase information can be measured with this approach. This is advantageous in order to detect partial discharge pulses, especially in noisy environments or with high-repetition rates.

It is thus proposed to use an IQ mixing approach without an envelope (or amplitude) detection approach, but acquiring both signals at the same time for further processing. In particular, by using cheaper off-the-shelf components and specifically designed and improved algorithms, better detection capabilities at lower costs are achievable compared to state of the art systems. Specific analysis algorithms are provided, which can use the simultaneously knowledge of both I and Q. The algorithms may help to improve the detection of peaks in the both signals and to further distinguish them from background.

Figure 7:
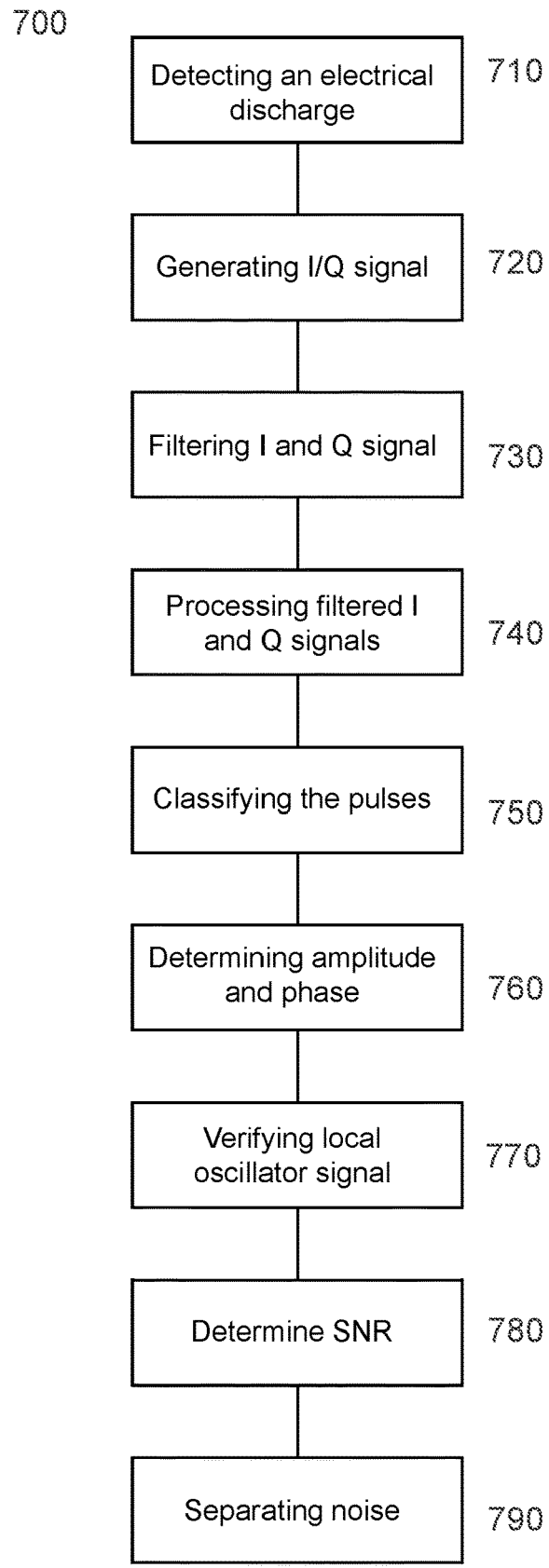
FIG. 7 shows a flowchart of embodiments of a method.

In a preferred embodiment, a method 700 for determining partial discharge in an electrical insulation system of a medium- or high voltage apparatus is disclosed. The method may comprise (see FIG. 7):

Detecting (box 710), in a first step with a sensing unit, an electrical signal that can comprise partial discharge pulses due to dielectric breakdowns in the electrical insulation system of the medium- or high voltage apparatus; Generating (box 720) an in-phase and a quadrature-signal from the electrical signal comprising the partial discharge pulses in an I/Q-mixer unit by multiplying, or mixing, the electrical signal comprising the partial discharge pulses with two local oscillator signals having the same frequency and a phase difference of 90°; Filtering (box 730) each of the in-phase and the quadrature-signals with a low-pass filter to have filtered signals as a result.

The low-pass filter may restrict the signal to a region corresponding to a range symmetrically distributed around central frequency/local oscillator frequency. For each of the signals (I- and Q path, see FIG. 2, 240, 250, 260, 270) a channel with sampled data exists. The two channels with sampled data can be subsequently used in an advantageous way, which allows that robustness of the partial discharge detection can be improved in an online setup. Online setup means monitoring a system which can suffer of partial discharge effects in a real environment e.g. a power station and not under optimised laboratory conditions.

Method 700 may further comprise: processing (box 740) the filtered in phase and the quadrature signals in a processing unit with a low-frequency Analog-Digital converter to obtain digital signals representing an in-phase and a quadrature value.

Figure 2:
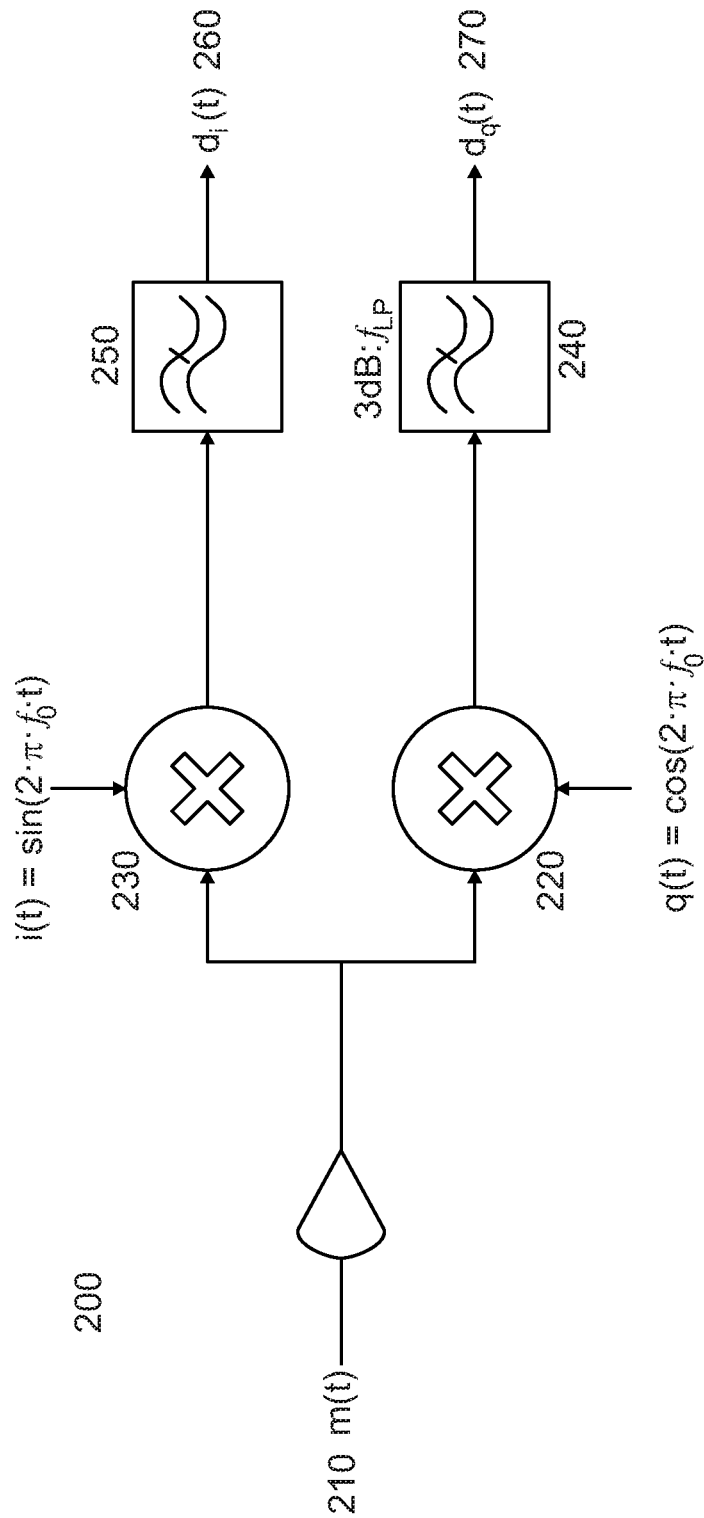
FIG. 2 shows embodiments of a mixer circuit.

FIG. 2 illustrates a general IQ mixing approach 200, leading to two signals 260, 270, capturing the frequency content within the selected band after additional low-pass filtering. A selected frequency band is ranging from f0−fLP to f0+fLP. A center frequency (local-oscillator frequency) of the band is given by f0. A center frequency of Local Oscillator 220, 230 can be easily changed on the fly to shift the frequency band as required.

In a further preferred embodiment, the method can further comprise: classifying (step in box 750) the detected partial discharge pulses as a phase-to-phase discharge or a phase-to-ground discharge by detecting a relative I/Q phase of peaks simultaneously acquired on two different electrical phases, wherein a presence of simultaneous discharges on the three electrical phases, with similar I/Q phase, may indicate an external discharge.

In a further aspect it is disclosed, that voltage signals, which may represent an in-phase and a quadrature value, can be suitable to be mapped in an I/Q plane and can be further processed by algorithms to get specific information from it, such as e.g. amplitude and phase information.

In a further aspect, the method may disclose, that a partial discharge peak can be determined (box 760) from the in-phase and quadrature-signals, the partial discharge peak can have an IQ-amplitude and a phase between I and Q axis in an I/Q plane.

In a further aspect of the method it is disclosed that IQ-amplitude may have a locally maximal amplitude and the phase can be a locally fixed phase. Due to its short time span, a partial discharge pulse is characterized by having (in a simplified view) a "frozen phase" with respect to the I/Q mixer. In an ideal I/Q mixer with a frequency much lower than the resolution of the partial discharge peak, the pulse can be approximated as a delta-peak and therefore, in the time-domain, we get the response of the low-frequency filtering with a phase between I and Q given by the phase that was present when the partial discharge occurred.

Figure 4:
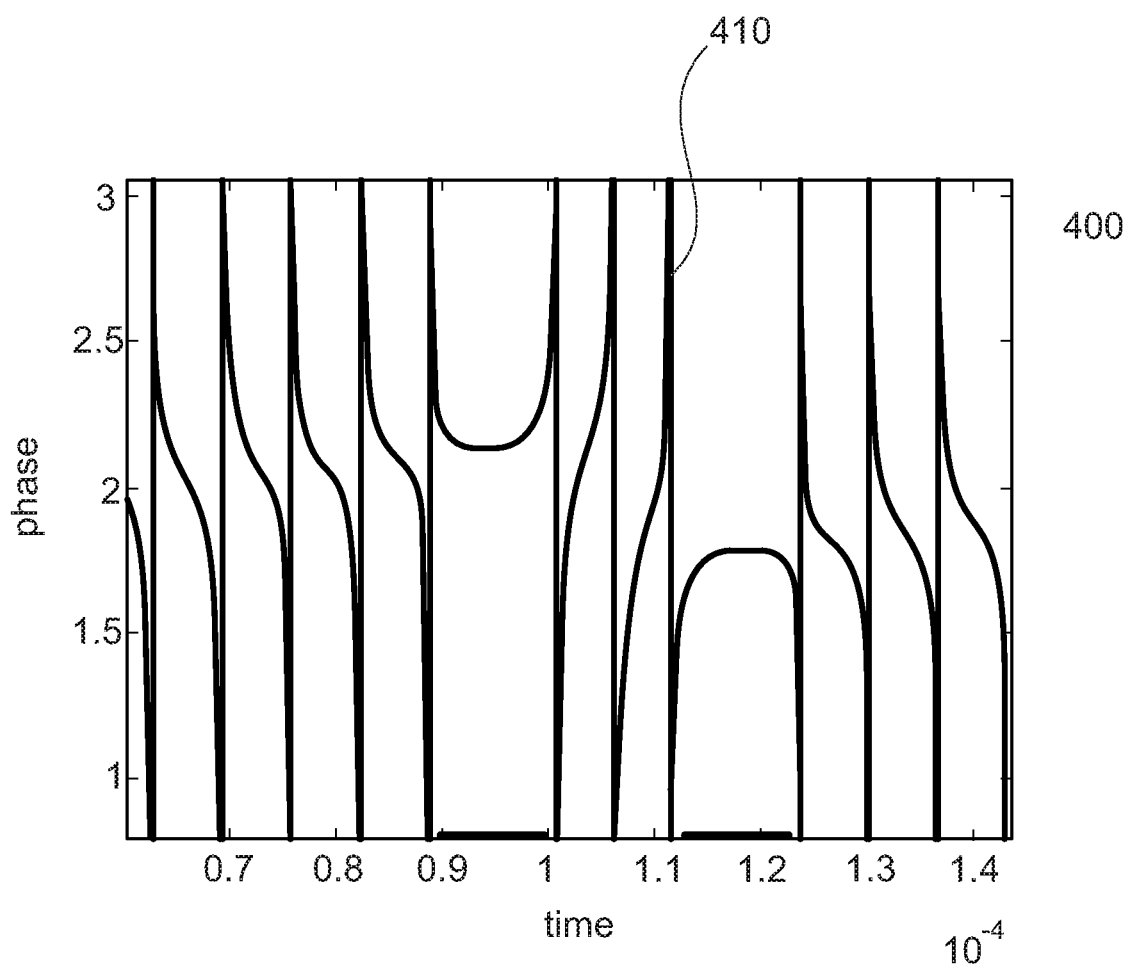
FIG. 4 shows a diagram of the signal phase, i.e. pulses have a constant phase

FIG. 4 illustrates, what is meant with "frozen phase" 410, 420. For short time spans, it can be seen, that the phase does not significantly change. (see time span 410 from about $0.9*10^{-4}$ s to $1*10^{-4}$ s and time span 420 from about $1.1*10^{-4}$ s to $1.25*10^{-4}$ s).

This "frozen phase" may essentially remain the same throughout the whole low-frequency response (as the low-frequency response is determined by the subsequent low-pass filter and not by the IQ mixer). The presence of a fixed phase for a short time can therefore be seen as an important signature of a real partial discharge signal compared to noise, whose phase is indeed randomly distributed. This "frozen phase" allows also for distinguishing peaks, which occur close to each other, such that the low-frequency response has not yet disappeared.

Classical partial discharge systems require a so-called "dead time" after each partial discharge pulse. That is to say that new pulses, occurring during this time, are not counted. It is expected that subsequent pulses will have approximately uniformly distributed phases because of their high frequency of f0 compared to the low-frequency response of the subsequent filter. Therefore a consecutive pulse will be distinguishable from the first one, by analysing both I and Q together, as these pulses will have separate, distinguishable phases 'attached' to them.

Figure 5:
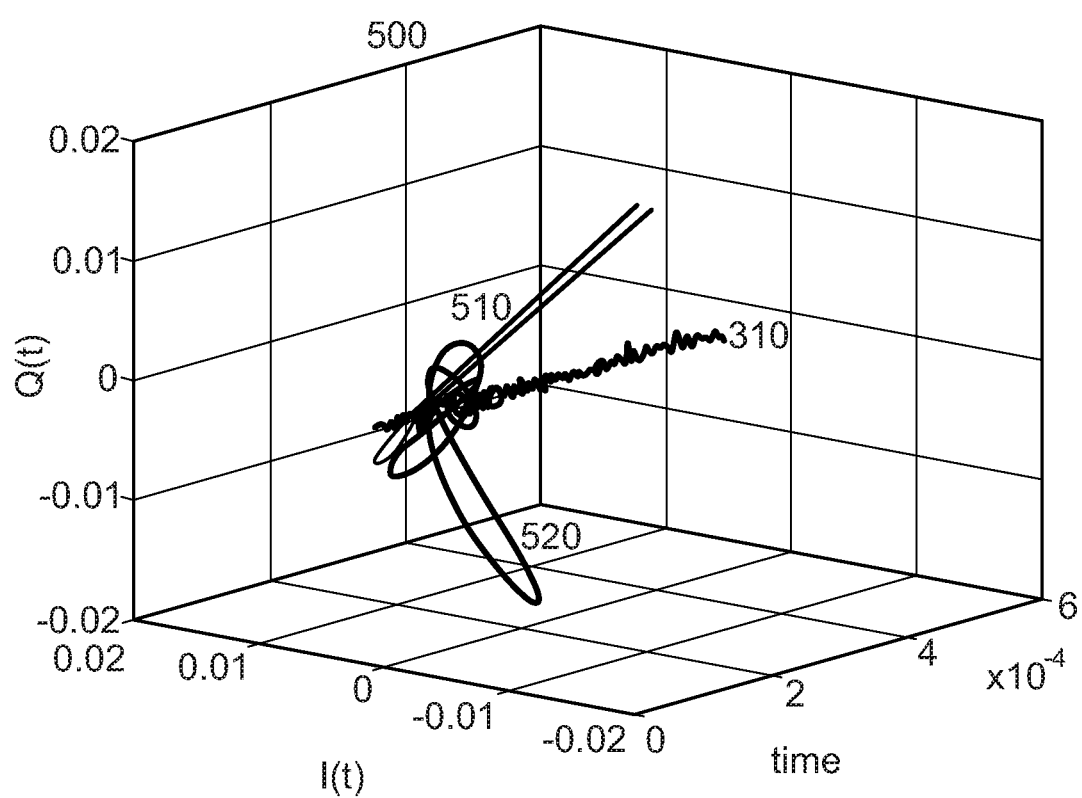
FIG. 5 shows a diagram with two partial discharge pulses and noise signals.

FIG. 5 shows in a simulation 500 two pulses close or "peaks" 510, 520 after performing an I/Q mixing of a signal, which are very close. But even if they followed very fast after another, the small angle between them is clearly visible. Noise signal 310 propagates on the time axis and does not show any specific peaks. Peaks and noise can therefore be easily distinguished with the presented method.

In a further aspect of the method, it is disclosed that the frequency of the local oscillator signals can be varied (box 770). The flexible choice of a frequency band may help in solving the problem of avoiding regions, where disturbances could occur, coming from "external noise" source. Noise can stem from other devices in the near of the measurement system, such as electric circuits with high and fast changing currents, alternating electric high voltage fields or noise from e.g. lightning strike. In addition, there is always noise introduced into the system from the electronics itself. The proposed system may be able to scan and analyse a broad frequency range in order to find a frequency band with the best signal-to-noise ratio, thus being more suitable for the partial discharge measurement.

The provided method and the system for carrying out the method is for an online monitoring market, especially in MV applications. The price of such a system is critical. The proposed system provides a good partial discharge pulse detection capability by using "off-the-shelf components", which are less costly.

In a further aspect of the method, it is disclosed that a frequency range can be in a range of 10 kHz to 50 MHz. Dependent on a varied frequency, it is possible to determine a signal to noise ratio (box 780). In order to be able to use the system in an online environment, noise reduction (or cancelation) may be an essential feature.

In a further optional aspect of the method it is disclosed, that generic noise can be separated (box 790) from partial discharge peaks and may be used as a measure for a signal to noise ratio.

Figure 3:
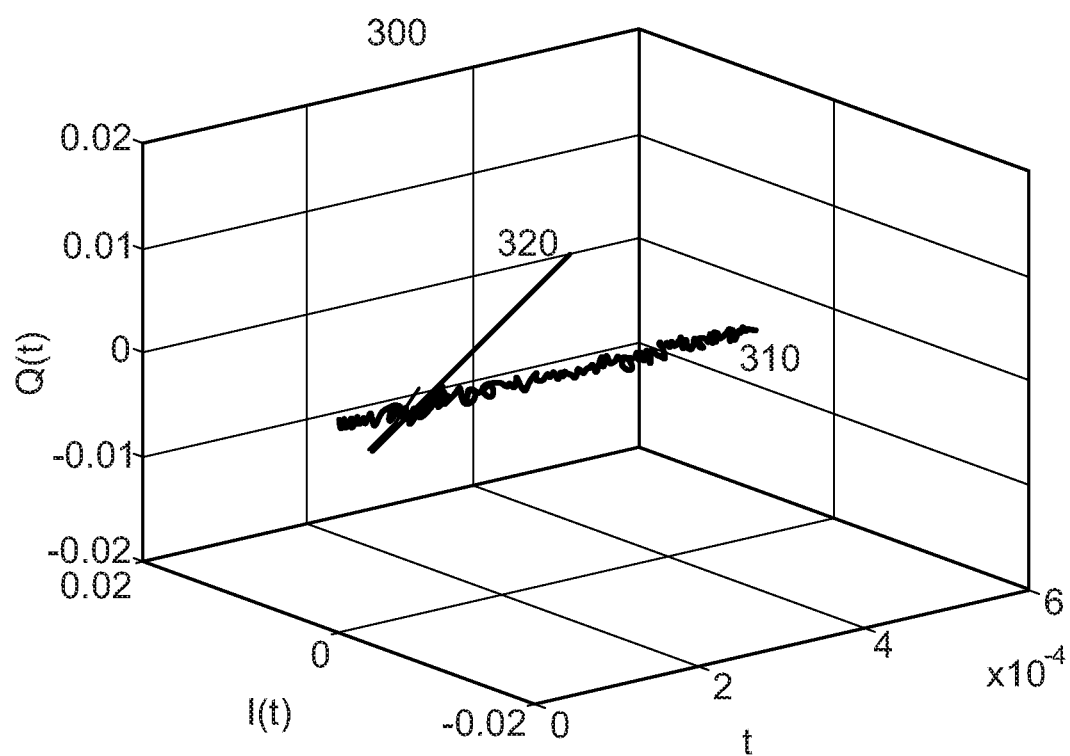
FIG. 3 shows a diagram with partial discharge pulses and noise signals.

To illustrate the capability of the current approach, FIG. 3 shows a simulation of a PD pulse after the IQ mixer. The peak 320 can be seen to have a fixed angle (phase) between I and Q (in Q(t) and I(t) plane), whereas the background noise 310 is distributed uniformly on the t-axis. No specific peaks are apparent in the noise signal.

In another aspect of the present disclosure, a partial discharge determining device adapted for detecting partial discharges in an electrical insulation system of a medium- or high voltage apparatus is provided. The device may comprise:

An input connector with a sensing unit adapted for coupling the device to medium- or high voltage apparatus, wherein an electrical signal from the medium- or high voltage apparatus may be detected by the sensing unit and can comprise electrical pulses, resulting from dielectric breakdowns in the electrical insulation system of the medium- or high voltage apparatus, the electrical signal being such as to be supplied to the device for determining electrical pulses via the input connector;

The device may further comprise an I/Q mixer unit 200, configured to generate an in-phase and a quadrature-signal from the electrical signal 210, wherein the electrical signal may comprise the partial discharge pulses by mixing the electrical signal comprising the partial discharge pulses with two local oscillator signals 220, 230 having the same frequency and wherein a phase difference between the two local oscillator signals can be 90°;

Low-pass filters 240, 250 may be comprised which can be configured to filter each of the in-phase signal and the quadrature signal; and a data-processing unit, that may be adapted to process the filtered in phase and the quadrature signals 260, 270 in a low-frequency Analog-Digital converter and configured to obtain voltage signals which may represent an in-phase and a quadrature value.

In a further aspect of the present invention, it is disclosed, that the data processing unit may be adapted to output the in-phase and a quadrature value. The data processing unit may also be configured to process the in-phase and quadrature value in an I/Q plane.

In a further aspect of the present invention, it is disclosed that the device may be adapted to determine a so called "transfer function" by performing multiple IQ measurements on the electrical signal 210, sensed by the sensing unit. The device may also be adapted to perform each measurement at a different local oscillator frequency. The measurements may be combined and processed accordingly.

In other words, suitable algorithms are proposed in order to be able to characterize a "transfer function" of the system in more detail, which is then advantageous in a multi-frequency measurement approach. That is, the I/Q signal with different frequencies f0 can be used as an approach to characterize the "transfer function".

The "transfer function" herein is the relation between the initially occurring partial discharge pulse and its propagation through the different parts of the signal chain (that is from the defect in/at the faulty isolation, through the bus bar, coupler of the partial discharge measurement system and the partial discharge acquisition itself, and finally to the IQ mixer).

This can be considered as an extension of currently performed frequency scanning in commercial partial discharge systems, which try to find the frequency band with the lowest signal-to-noise ratio. Only an integral value of the ratio between partial discharge strength and measured peaks are analysed by them.

With a full I/Q signal it is possible to analyse this in a more detailed way as a function of frequency, e.g. identify possible resonance positions. This can be used either to improve the measurement accuracy and its matching between different frequencies, or by speeding up the calibration procedure needed for the installation.

Therefore, the transfer function of the whole installation is a valuable information that is not readily available using traditional partial discharge measurement system.

In particular, the transfer function of the installation can provide a quantitative description of the propagation of the partial discharge signals (e.g. propagation delay and attenuation) and of the switchgear system itself (e.g. system resonances).

By relying on multiple I/Q measurements with different central frequencies and combining them appropriately, it can be possible to estimate the transfer function or, alternatively, the impulse response of the installation. To this aim, it may be possible to use a partial discharge charge injector at a known location and use different IQ frequencies f0 when collecting the measurements.

Knowledge of the transfer function can enable to solve problems like estimation of an accurate partial discharge amplitude, localize partial discharges and detection of system changes.

In a further aspect of the present invention, it is disclosed that the device may be further adapted to determine directly consecutive discharge pulses by analysing I/Q signals. The device may further be configured to detect phases which can be linked with each of the consecutive discharge pulses.

To identify consecutive partial discharge pulses, that is identifying peaks that are close to each other, the proposed I/Q approach advantageously allows to determine and use a phase difference between two pulses as shown in FIG. 5. In addition, it can advantageously avoid or reduce a dead time after each detected partial discharge pulse during the response of the low-pass filter.

An algorithm can be employed for this, e.g. an algorithm, that may search for a first partial discharge signal, identifies its phase and then removes this first signal from the measurements. A second search may then be performed, which can find a second partial discharge peak with a substantially different phase in the remaining measurement. Alternatively, one could define a dead time not globally, but restricted to certain phase regions, e.g. restricted to some quadrants in the IQ plane.

In a further aspect of the present invention a data-processing unit is disclosed which may comprise a computing unit, which may be adapted to determine a partial-discharge peak from the in-phase and the quadrature signals. The processing unit may be designed to quickly perform signal processing as necessary in the present application.

In a further aspect of the present application it is disclosed that the sensing unit may comprise an antenna, or a transformer or a capacitive coupler. Said antenna, transformer or capacitive coupler may be adapted to sense a signal in a predetermined frequency band.

In yet another aspect of the present application, a medium- or high voltage apparatus with a partial discharge determining device is disclosed, comprising one or more aspects previously disclosed.

In yet another aspect of the present application, the sensing unit may be arranged in the medium or high voltage apparatus arranged in or adjacent to the medium or high voltage apparatus, that means e.g. arranged in a transformer or arranged near a busbar or near an outside insulator or a switchgear.

In yet another aspect, the device according to one or more embodiments may further comprise a network interface for connecting the device to a data network, in particular a global data network. The data network may employ a TCP/IP network such as used for Internet. The device is operatively connected to the network interface for carrying out commands received from the data network.

The commands may include a control command for controlling the device to carry out a task such as initiating a PD measurement. In this case, the device/controller is adapted for carrying out the task in response to the control command. The commands may include a status request. In response to the status request, or without prior status request, the device/controller may be adapted for sending a status information to the network interface, and the network interface is then adapted for sending the status information over the network. The commands may include an update command including update data. In this case, the device/controller is adapted for initiating an update in response to the update command and using the update data. The device and the network interface are adapted to receive and transmit any data generated by the device. The device may be fully controllable via the network interface.

The data network may be an Ethernet network using TCP/IP such as LAN, WAN or Internet. The data network may comprise distributed storage units such as Cloud. Depending on the application, the Cloud can be in form of public, private, hybrid or community Cloud.

To sum up, the present application as previously described, provides a method and a hardware design to measure and analyse Partial Discharge (PD) in order to evaluate problems and status of insulation systems.

The proposed approach, which is provided here, uses a 'full' I/Q-mixing to shift a partial discharge signal from a central frequency to zero frequency compared to common partial discharge measurement systems on the market, which instead use a band-pass filter in a pre-selected frequency band(s) together with an envelope detection system, which can then only measure an amplitude of the partial discharge signal.

This full I/Q data acquisition has, among other, following advantages:

A partial discharge pulse is, due to its short time span, characterized by having (in a simplified view) a "frozen phase" with respect to the IQ mixer (see FIGS. 3, 4 and 5). Partial discharge peaks 320, 510, 520 are clearly visible in the I/Q plane. Noise signals 310 are clearly distinguishable from the partial discharge peaks 320, 510, 520.

The measurement of both I and Q, instead of an envelope or amplitude alone, may have the advantage that it can be used to identify individual peaks due to the fact that the phase between I and Q will be frozen during the full low-frequency response. The doubling of the data acquisition required for this, which might be a disadvantage of this method, is fully compensated by its advantages.

This is used on the one hand to detect partial discharge signals due to their frozen phase and to detect or suppress noise. This can be done by either deriving the phase itself and confirming the constancy of the phase by some criteria, or alternatively by doing an analysis, where the search for a pattern with a constant (but unknown) phase may be part of the search algorithm. The "frozen-phase" may also, as previously discussed, allow for separation of consecutive pulses, which are partial discharge pulses following very fast one after another.

By determining this, it may be possible to evaluate, which kind of partial discharge has occurred and eventually the location of the source (in busbar, isolation, air . . . ) of the partial discharge in medium- or high voltage installation.

As a further advantage of the proposed approach it may be considered, that using an ideal I/Q mixer in many "low-frequency" I/Q systems is not always necessary. There are of course many advantages of using an ideal I/Q mixer (see FIGS. 610-630), especially some of the underlying mathematical properties are only valid in those case.

I/Q systems which can be used for the provided approach can advantageously be based on square signals instead of sinusoidal signals. Square signals are easier to generate (i.e. the so-called switching mixer techniques). This simple approach is sometimes considered as a disadvantage, whereas the approach with square signals may have an advantageous effect here.

Figure 6:
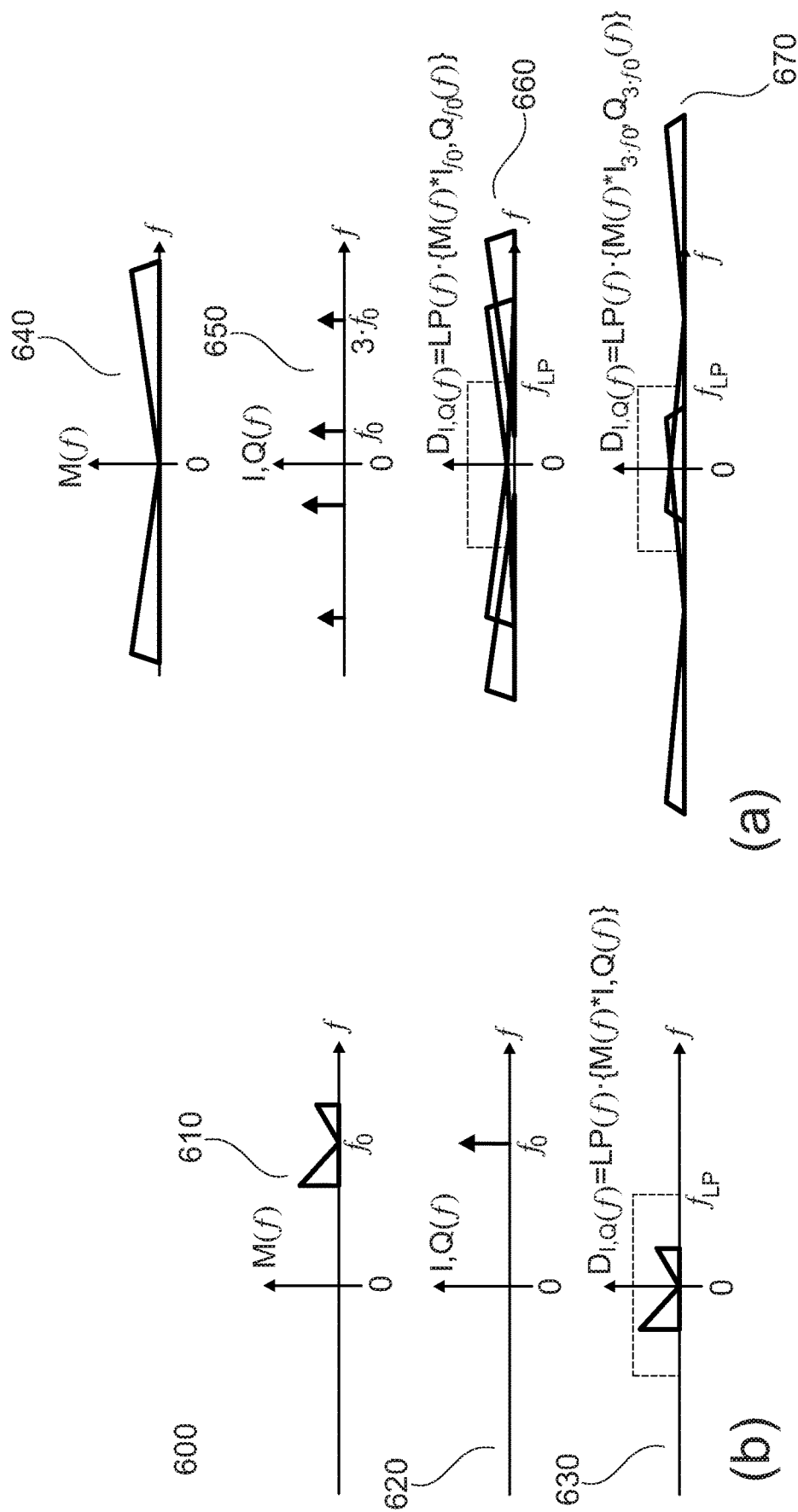
FIG. 6(a) and FIG. 6(b) show effects from different embodiments of mixers.

Due to higher frequency components present in the square wave, it allows to acquire information on frequency ranges that does contain not only the base band. This can be used in connection with multiple frequencies either to improve the measurement or alternatively to speed up the calibration process. FIG. 6 illustrates difference and effect of using an ideal mixer (a) 610 to 630 or a switching regulator (b) 640 to 670.

Many commercial IQ mixer chips (especially those in the low-frequency, MHz and sub-MHz region) make use of a rough approximation to the sine and cosine function, based on a pure square-wave. The advantage is, that these waves are easier to generate, just dividing a higher frequency and using pure switches. For a band-limited signal, with no frequency content in the higher frequency part of the square wave, i.e. at the odd harmonics of f0 as shown in (b) of FIG. 6, this is not a restriction. This is different here, since partial discharge is a very wide band signal.

There is therefore a higher contribution of the partial discharge signal from a larger number of higher frequencies (see FIG. 6(b), 640-670).

Whereas this can be seen as a disadvantage compared to an ideal electronics (as amplitude distortion is introduced), in the provided application there are several advantages in such a non-ideal IQ. Apart from the reduced cost, such a measurement allows to gather at the same time not only the base frequency content, but also higher ones. In the cases disturbances are narrow banded (and minimized in the imaged frequency ranges), usage of several frequency ranges improves the signal to noise ratio.

In addition, by combining a larger number of frequencies, it is possible to scan the whole frequency range with fewer measurements. This is particularly important during the commissioning phase where the partial discharge measurement system is calibrated via the use of a partial discharge charge injector.

The invention claimed is:

1. A method for determining partial discharge in an electrical insulation system of a medium- or high voltage apparatus, comprising:
   detecting, with a sensing unit, an electrical signal that comprises partial discharge pulses due to dielectric breakdowns in the electrical insulation system of the medium- or high voltage apparatus;
   wherein the sensing unit comprises an antenna, or a transformer or a capacitive coupler;
   generating an in-phase and a quadrature signals from the electrical signal comprising the partial discharge pulses in an I/Q-mixer unit by mixing the electrical signal comprising the partial discharge pulses with two local oscillator signals having the same frequency and a phase difference of 90°;
   wherein the I/Q-mixer unit comprises local oscillator;
   filtering each of the in-phase and the quadrature signals with a low-pass filter, wherein the low-pass filter is configured to restrict the in-phase and quadrature signals to a region corresponding to a range symmetrically distributed around a central local oscillator frequency;
   processing the filtered in-phase and the quadrature (I/Q) signals with the low-pass filter;
   processing the filtered in-phase and the quadrature (I/Q) signals in a processing unit with an Analog-Digital converter to obtain digital signals representing an in-phase and a quadrature value; and
   distinguishing or suppressing noise from the partial discharge pulses by determining directly consecutive discharge pulses by analysing the I/Q signals and detecting locally fixed phases linked with each of the consecutive discharge pulses.

2. The method according to claim 1, further comprising classifying the detected partial discharge pulses as a phase-to-phase discharge or a phase-to-ground discharge by detecting a relative I/Q phase of peaks simultaneously acquired on two different electrical phases; and/or classifying a presence of simultaneous discharges on the three electrical phases as an indication of an external discharge or disturbance.

3. The method according to claim 1, wherein voltage signals representing the in-phase and quadrature value, are suitable to be mapped in an I/Q plane.

4. The method according to claim 1, further comprising determining from the in-phase and quadrature-signals a partial discharge peak, the partial discharge peak having an IQ-amplitude and a phase between I and Q axis.

5. The method according to claim 4, wherein the IQ-amplitude is a locally maximal amplitude.

6. The method according to claim 1, wherein the method further comprises varying the frequency of the local oscillator signals.

7. The method according to claim 1, further adapted to determine a transfer function by performing multiple IQ measurements on the electrical signal, sensed by the sensing unit, wherein measurements are performed at different local oscillator frequencies and the measurements are combined and processed accordingly, wherein the transfer function is a relation between an initially occurring partial discharge pulse and its propagation through different parts of the electrical signal.

8. The method according to claim 6, wherein the method further comprises determining a signal-to noise ratio dependent on the varied frequency.

9. The method according to claim 1, wherein the method further comprises separating generic noise from PD peaks based on I/Q information and using it as a measure for a signal-to-noise ratio.

10. The method according to claim 2, wherein voltage signals representing the in-phase and quadrature value, are suitable to be mapped in an I/Q plane.

11. The method according to claim 2, further comprising determining from the in-phase and quadrature-signals a partial discharge peak, the partial discharge peak having an IQ-amplitude and a phase between I and Q axis.

12. The method according to claim 2, wherein the method further comprises varying the frequency of the local oscillator signals.

13. A partial discharge determining device for detecting partial discharges in an electrical insulation system of a medium- or high voltage apparatus, comprising:
an input connector with a sensing unit for coupling the device to the medium- or high voltage apparatus, wherein an electrical signal from the medium- or high voltage apparatus is detected by the sensing unit and comprises electrical pulses resulting from dielectric breakdowns in the electrical insulation system of the medium- or high voltage apparatus, the electrical signal being able to be supplied to the device for determining electrical pulses via the input connector;
wherein the sensing unit comprises an antenna, or a transformer or a capacitive coupler;
an I/Q mixer unit, configured to generate an in-phase and a quadrature-signal from the electrical signal comprising the partial discharge pulses by mixing the electrical signal comprising the partial discharge pulses with two local oscillator signals having a same frequency, wherein a phase difference between the two local oscillator signals is 90°;
wherein the I/Q-mixer unit comprises local oscillator;
low-pass filters, configured to filter each of the in phase and the quadrature signal, wherein the low-pass filters are configured to restrict the in phase and the quadrature signal to a region corresponding to a range symmetrically distributed around a central local oscillator frequency; and
a data-processing unit, adapted to process the filtered in-phase and the quadrature signals in a low-frequency Analog-Digital converter and to obtain voltage signals representing an in-phase and a quadrature value; wherein
the data-processing unit is adapted to distinguish or suppress noise from partial discharge pulses by determining directly consecutive discharge pulses by analysing the I/Q signals and detecting locally fixed phases linked with each of the consecutive discharge pulses.

14. The device according to claim 13, further comprising a network interface for connecting the device to a data network, wherein the device is operatively connected to the network interface for at least one of carrying out a command received from the data network and sending device status information to the data network and/or comprising a processing unit for converting one or more signals, generated from the device, into a digital signal.

15. The device according to claim 13, further adapted to determine a transfer function by performing multiple IQ measurements on the electrical signal, sensed by the sensing unit, wherein measurements are combined and processed accordingly, wherein the transfer function is a relation between an initially occurring partial discharge pulse and its propagation through different parts of the electrical signal.

16. The device according to claim 13, wherein the data processing unit comprises a computing unit adapted to determine a partial-discharge peak from the in-phase and the quadrature signals; and/or wherein the sensing unit comprises an antenna, or a transformer or a capacitive coupler, adapted to sense a signal in a predetermined frequency band.

17. A medium- or high voltage apparatus with a partial discharge determining device according to claim 13; wherein the sensing unit is arranged in or adjacent to the medium- or high voltage apparatus.

18. The device according to claim 14, wherein the data processing unit comprises a computing unit adapted to determine a partial-discharge peak from the in-phase and the quadrature signals; and/or wherein the sensing unit adapted to sense a signal in a predetermined frequency band.

19. A method for determining a transfer function in a partial discharge measuring system for detecting partial discharges in an electrical insulation system of a medium- or high voltage apparatus, comprising:
detecting, with a sensing unit, an electrical signal that comprises partial discharge pulses due to dielectric breakdowns in the electrical insulation system of the medium- or high voltage apparatus;
wherein the sensing unit comprises an antenna, or a transformer or a capacitive coupler;
generating an in-phase and quadrature signals from the electrical signal comprising the partial discharge pulses in an I/Q-mixer unit by mixing the electrical signal comprising the partial discharge pulses with two local oscillator signals having a same frequency and a phase difference of 90°;
wherein the I/Q-mixer unit comprises local oscillator;
filtering each of the in-phase and the quadrature signals with a low-pass filter, wherein the low-pass filter is configured to restrict the in-phase and the quadrature signals to a region corresponding to a range symmetrically distributed around a central local oscillator frequency;

processing the filtered in-phase and the quadrature (I/Q) signals in a processing unit with an Analog-Digital converter to obtain digital signals representing an in-phase and a quadrature value;

performing multiple IQ measurements on the electrical signal, sensed by the sensing unit, to determine a transfer function, wherein measurements are performed at different local oscillator frequencies and the measurements are combined and processed accordingly, wherein the transfer function is a relation between an initially occurring partial discharge pulse and its propagation through different parts of the electrical signal.

20. A partial discharge determining device for detecting partial discharges in an electrical insulation system of a medium- or high voltage apparatus, comprising:

an input connector with a sensing unit for coupling the device to the medium- or high voltage apparatus, wherein an electrical signal from the medium- or high voltage apparatus is detected by the sensing unit and comprises electrical pulses resulting from dielectric breakdowns in the electrical insulation system of the medium- or high voltage apparatus, the electrical signal being able to be supplied to the device for determining electrical pulses via the input connector;

wherein the sensing unit comprises an antenna, or a transformer or a capacitive coupler;

an I/Q mixer unit, configured to generate an in-phase and a quadrature-signal from the electrical signal comprising the partial discharge pulses by mixing the electrical signal comprising the partial discharge pulses with two local oscillator signals having a same frequency, wherein a phase difference between the two local oscillator signals is 90°;

wherein the I/Q-mixer unit comprises local oscillator;

low-pass filters, configured to filter each of the in-phase and the quadrature signal, wherein the low-pass filter is configured to restrict the in-phase and the quadrature signal to a region corresponding to a range symmetrically distributed around a central local oscillator frequency;

a data-processing unit, adapted to process the filtered in-phase and the quadrature signals in a low-frequency Analog-Digital converter and to obtain voltage signals representing an in-phase and a quadrature value; and wherein the partial discharge determining device is adapted to determine a transfer function by performing multiple IQ measurements on the electrical signal, sensed by the sensing unit, wherein measurements are performed at different local oscillator frequencies and the measurements are combined and processed accordingly, wherein the transfer function is a relation between an initially occurring partial discharge pulse and its propagation through different parts of the electrical signal.

* * * * *